(12) United States Patent
Lee

(10) Patent No.: US 11,527,575 B2
(45) Date of Patent: Dec. 13, 2022

(54) MEMORY DEVICE INCLUDING MULTIPLE DECKS

(71) Applicant: SK hynix Inc., Icheon (KR)

(72) Inventor: Hyung Dong Lee, Suwon (KR)

(73) Assignee: SK hynix Inc., Icheon (KR)

( * ) Notice: Subject to any disclaimer, the term of this patent is extended or adjusted under 35 U.S.C. 154(b) by 131 days.

(21) Appl. No.: 16/853,386

(22) Filed: Apr. 20, 2020

(65) Prior Publication Data

US 2021/0074767 A1 Mar. 11, 2021

(30) Foreign Application Priority Data

Sep. 6, 2019 (KR) ..................... 10-2019-0110943

(51) Int. Cl.
*H01L 27/24* (2006.01)
*H01L 23/522* (2006.01)
*H01L 23/528* (2006.01)
*H01L 45/00* (2006.01)

(52) U.S. Cl.
CPC ........ *H01L 27/2481* (2013.01); *H01L 23/528* (2013.01); *H01L 23/5226* (2013.01); *H01L 27/2436* (2013.01); *H01L 27/2409* (2013.01); *H01L 45/146* (2013.01)

(58) Field of Classification Search
CPC ............ H01L 27/2481; H01L 23/5226; H01L 23/528; H01L 27/2436; H01L 45/04; H01L 45/06; H01L 45/1233; H01L 21/8238; H01L 27/092; H01L 45/1206; H01L 45/1253; H01L 45/146; H01L 27/2409; G11C 2207/005; G11C 5/02; G11C 7/18; G11C 8/10; G11C 8/14; G11C 2213/71; G11C 2213/72; G11C 2213/79; G11C 13/003; G11C 5/063; G11C 13/0002

See application file for complete search history.

(56) References Cited

U.S. PATENT DOCUMENTS

| 8,848,424 | B2 | 9/2014 | Ikeda et al. |
| 2014/0056055 | A1* | 2/2014 | Ikeda ............... H01L 27/2481 365/148 |
| 2017/0186485 | A1* | 6/2017 | Kim ................ G11C 13/0038 |

FOREIGN PATENT DOCUMENTS

KR 20160023480 A 3/2016

\* cited by examiner

*Primary Examiner* — Patricia D Valenzuela

(57) ABSTRACT

A memory device includes first to nth decks respectively coupled to first to nth row lines which are stacked over a substrate in a vertical direction perpendicular to a surface of the substrate, n being a positive integer, a first connection structure extending from the substrate in the vertical direction to be coupled to the first row line, even-numbered connection structures extending from the substrate in the vertical direction and respectively coupled to ends of even-numbered row lines among the second to nth row lines, and odd-numbered connection structures extending from the substrate in the vertical direction and respectively coupled to ends of odd-numbered row lines among the second to nth row lines. The even-numbered connection structures are spaced apart from the odd-numbered connection structures with the first row line and the first connection structure that are interposed between the even-numbered connection structures and the odd-numbered connection structures.

15 Claims, 10 Drawing Sheets

MEMORY DEVICE INCLUDING MULTIPLE DECKS

CROSS-REFERENCE TO RELATED APPLICATION

The present application claims priority under 35 U.S.C. § 119(a) to Korean Patent Application Number 10-2019-0110943, filed on Sep. 6, 2019, which is incorporated herein by reference in its entirety.

BACKGROUND

Field of Invention

Various embodiments of the present disclosure generally relate to a memory device, and more particularly, to a variable resistance memory device.

Description of Related Art

Electronic devices, such as a computer, a digital camera, and a smartphone, may process data using a memory system. A memory system may include a memory device including a memory cell storing data and a controller controlling the memory device.

Various memory devices have been developed as memory devices trend toward high performance, miniaturization, and low power consumption. Variable resistance memory devices have been proposed as an example of next-generation memory devices. Variable resistance memory devices may have different resistance states depending on a voltage or current applied to a memory cell and maintain a resistance state stored in a memory cell independently of an externally supplied power. Examples of variable resistance memory devices include Phase change Random Access Memory (PRAM), Magnetic RAM (MRAM), Resistive RAM (RRAM), Ferroelectric RAM (FRAM), an e-fuse, and so on.

SUMMARY

According to an embodiment, a memory device may include first to nth decks respectively coupled to first to nth row lines which are stacked over a substrate in a vertical direction perpendicular to a surface of the substrate, n being a positive integer, a first connection structure extending from the substrate in the vertical direction to be coupled to the first row line, even-numbered connection structures extending from the substrate in the vertical direction and respectively coupled to ends of even-numbered row lines among the second to nth row lines, and odd-numbered connection structures extending from the substrate in the vertical direction and respectively coupled to ends of odd-numbered row lines among the second to nth row lines. The even-numbered connection structures may be spaced apart from the odd-numbered connection structures with the first row line and the first connection structure that are interposed between the even-numbered connection structures and the odd-numbered connection structures.

According to an embodiment, a memory device may include a substrate including first select components, which include N-channel metal oxide semiconductor (NMOS) transistors, and a second select component, which includes P-channel metal oxide semiconductor (PMOS) transistors, a plurality of decks each including a plurality of memory cells and stacked over the substrate in a vertical direction perpendicular to a surface of the substrate, row lines coupled to the first select components, respectively, and coupled to the decks, respectively, and column lines coupled in common to one of the PMOS transistors of the second select component, and coupled to the decks.

According to an embodiment, a memory device may include a substrate, a P-channel metal oxide semiconductor (PMOS) transistor formed in the substrate, first to fourth N-channel metal oxide semiconductor (NMOS) transistors formed in the substrate, first to fourth row lines coupled to the first to fourth NMOS transistors, respectively, spaced apart from each other in a vertical direction perpendicular to a surface of the substrate, and extending in parallel with each other, first and second column lines coupled in common to the PMOS transistor, spaced apart from each other in the vertical direction, and extending in a direction which crosses a direction in which the first to fourth row lines extend, a first memory cell coupled to the first row line and the first column line, a second memory cell coupled to the second row line and the first column line, a third memory cell coupled to the third row line and the second column line, and a fourth memory cell coupled to the fourth row line and the second column line. The first NMOS transistor may be disposed between the second NMOS transistor and the third NMOS transistor, and the second NMOS transistor may be disposed between the first NMOS transistor and the fourth NMOS transistor.

DETAILED DESCRIPTION

The specific structural or functional description disclosed herein is merely illustrative for the purpose of describing embodiments according to the concept of the present disclosure. The embodiments according to the concept of the present disclosure may be implemented in various forms, and should not be construed as limited to the embodiments set forth herein.

Various embodiments of the present disclosure provide a memory device capable of reducing a chip size.

Figure 1:
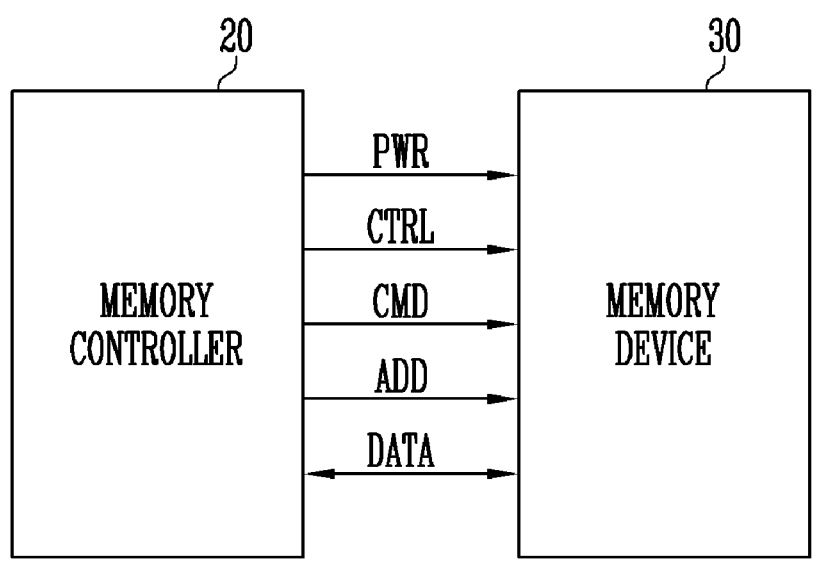
FIG. 1 illustrates a memory system according to an embodiment.

FIG. 1 illustrates a memory system 10 according to an embodiment.

Referring to FIG. 1, the memory system 10 may include a memory controller 20 and a memory device 30.

The memory controller 20 may control general operations of the memory system 10 and control data exchange between an external device (for example, a host) and the memory device 30. For example, the memory controller 20 may be configured to generate a command CMD and an address ADD corresponding to a request received from the host and to provide the command CMD and the address ADD to the memory device 30.

The memory device 30 may include a cross-point memory device including a memory cell disposed in an intersection of a row line and a column line. For example, the memory device 30 may include a variable resistance memory device. Hereinafter, embodiments based on a variable resistance memory device will be described. However, the present disclosure is not limited thereto, and may be applied to various cross-point memory devices in addition to the variable resistance memory device. The row line and the column line of the memory device 30 may be conductive lines capable of transmitting an electrical signal to the memory cell.

The memory device 30 may be configured to perform a read operation and a write operation in response to the command CMD and the address ADD provided from the memory controller 20. The memory device 30 may exchange data DATA with the memory controller 20. In addition, the memory device 30 may receive power PWR from the memory controller 20 through a power line and a control signal CTRL from the memory controller 20 through a control line.

Figure 2:
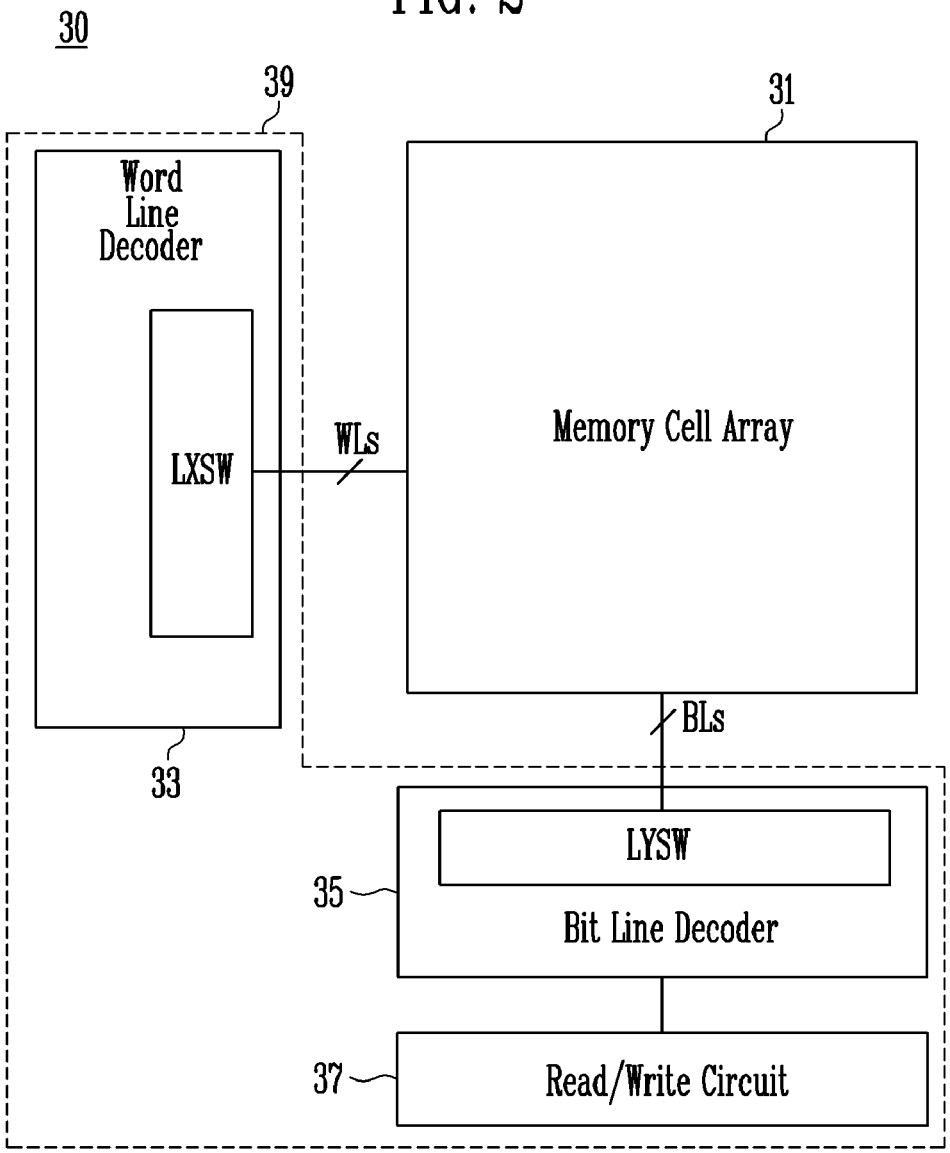
FIG. 2 illustrates a memory device according to an embodiment.

FIG. 2 illustrates the memory device 30 of FIG. 1 according to an embodiment.

Referring to FIG. 2, the memory device 30 may include a peripheral circuit 39 and a memory cell array 31. The peripheral circuit 39 may include a word line decoder 33, a bit line decoder 35, and a read/write circuit 37.

The memory cell array 31 may include a cross-point array. For example, the memory cell array 31 may include memory cells disposed in intersections of word lines WLs and bit lines BLs that cross each other. The memory cell array 31 may include memory cells arranged to form multiple decks and have a three-dimensional structure.

The memory cell array 31 may be coupled to the word line decoder 33 through the word lines WLs. The word line decoder 33 may include a word line select component LXSW configured to select one or more of the word lines WLs according to an address.

The memory cell array 31 may be coupled to the bit line decoder 35 through the bit lines BLs. The bit line decoder 35 may include a bit line select component LYSW configured to select one or more of the bit lines BLs according to an address.

The read/write circuit 37 may detect data of a selected memory cell during a read operation. The read/write circuit 37 may write data to a selected memory cell during a write operation. The read/write circuit 37 may detect data of a selected memory cell or write data to a selected memory cell by providing a bit line coupled to memory cells with various voltages or various currents used for a read operation or a write operation.

Figure 3A:
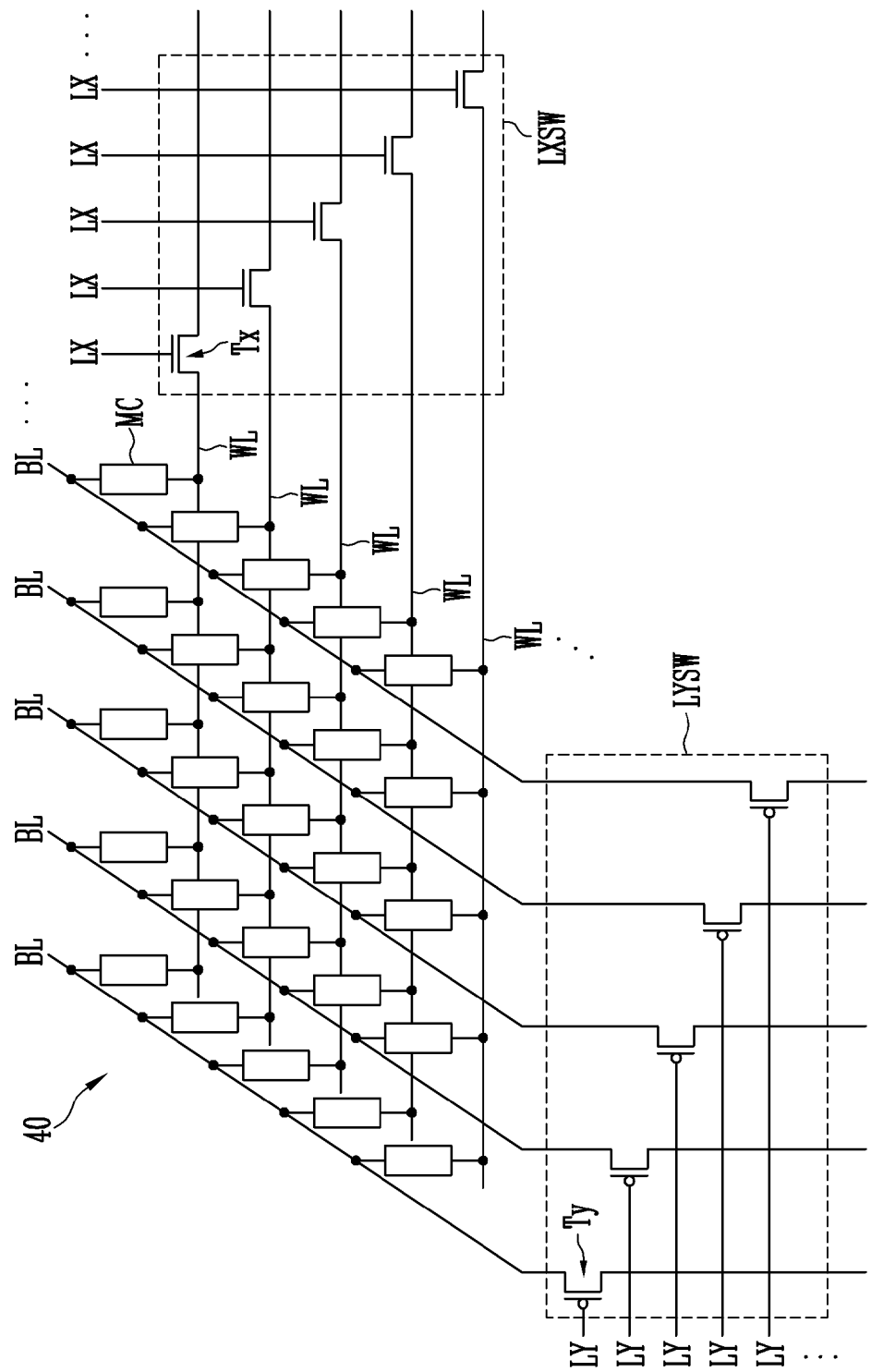
FIGS. 3A and 3B illustrate a memory device according to an embodiment.
Figure 3B:
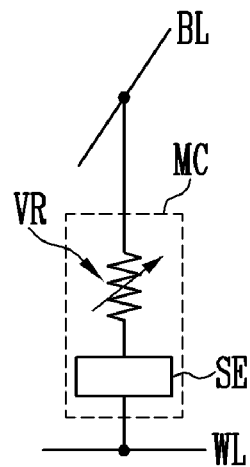

FIGS. 3A and 3B illustrate a memory device according to an embodiment. FIG. 3A illustrates a word line select component LXSW and a bit line select component LYSW that are coupled to a cross-point array 40 of the memory device. FIG. 3B illustrates a memory cell MC shown in FIG. 3A. The memory device illustrated in FIGS. 3A and 3B may correspond to the memory device 30 illustrated in FIG. 2. Therefore, the memory device illustrated in FIGS. 3A and 3B may be described with reference to FIG. 2.

Referring to FIG. 3A, the memory cell array 31 shown in FIG. 2 may include the cross-point array 40. The cross-point array 40 may include a plurality of word lines WL and a plurality of bit lines BL that cross each other. The bit lines BL may be spaced apart from the word lines WL in a vertical direction. The word lines WL may extend in parallel with each other and may be spaced apart from each other on a plane crossing the vertical direction. The bit lines BL may extend in parallel with each other and may be spaced apart from each other on a plane crossing the vertical direction. According to an embodiment, the bit lines BL may be arranged over the word lines WL in the vertical direction, as shown in FIG. 3A. In another embodiment, the bit lines BL may be arranged below the word lines WL in the vertical direction.

A plurality of memory cells MC may be disposed in intersections of the word lines WL and the bit lines BL in a one-to-one manner. Each of the memory cells MC may be selected by selecting a corresponding one of the word lines WL and selecting a corresponding one of the bit lines BL. A write operation for a selected memory cell MC may be performed by applying a predetermined electrical signal to a word line WL and a bit line BL that are coupled to the selected memory cell MC. Information stored in the selected memory cell MC may be read by the bit line BL to which the selected memory cell MC is coupled.

The word line select component LXSW coupled to the word lines WL may include a plurality of word line select transistors Tx. The bit line select component LYSW coupled to the bit lines BL may include a plurality of bit line select transistors Ty. The word line select transistors Tx may transmit electrical signals to the word lines WL in response to word line select signals LX, respectively. The bit line select transistors Ty may transmit electrical signals to the bit lines BL in response to bit line select signals LY, respectively.

The word line select transistors Tx may have a different type from the bit line select transistors Ty. According to an embodiment, each of the word line select transistors Tx may be an N-channel metal oxide semiconductor (NMOS) transistor and each of the bit line select transistors Ty may be a P-channel metal oxide semiconductor (PMOS transistor), as shown in FIG. 3A. However, the present disclosure is not limited thereto. In another embodiment, each of the word line select transistors Tx may be a PMOS transistor and each of the bit line select transistors Ty may be an NMOS transistor.

Referring to FIGS. 3A and 3B, a memory cell MC may be connected to a corresponding word line WL and a corresponding bit line BL, and the memory cell MC may include a select device SE and a variable resistance device VR that are coupled in series between the corresponding word line WL and the corresponding bit line BL.

The select device SE may be electrically coupled to the corresponding word line WL, and the variable resistance device VR may be electrically coupled to the corresponding bit line BL.

The select device SE may control a current flow according to a level of a voltage or current applied to the select device SE. The select device SE may include any of various devices such as a MOS transistor, a PN diode, an Ovonic Threshold Switching (OTS) device, and the like.

The variable resistance device VR may include a variable resistance layer capable of transitioning between different resistance states according to a voltage or current applied to the variable resistance device VR. The variable resistance device VR may include a variable resistance element of a magnetic RAM (MRAM), a resistive RAM (RRAM), a ferroelectric RAM (FRAM), a phase change RAM (PRAM), or the like. For example, the variable resistance device VR may transition to a high resistance state or a low resistance state by a voltage applied to the corresponding word line WL and the corresponding bit line BL. A write operation for changing a resistance state of the memory cell MC from a high resistance state to a low resistance state may be defined as a set operation. A write operation for changing the resistance state of the memory cell MC from a low resistance state to a high resistance state may be defined as a reset operation.

Figure 4A:
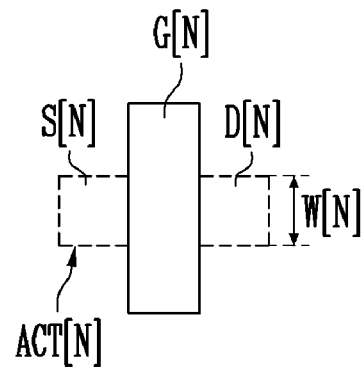
FIGS. 4A and 4B are plan views respectively illustrating an NMOS transistor and a PMOS transistor according to embodiments.
Figure 4B:
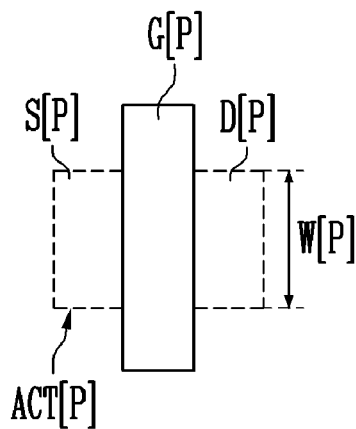

FIGS. 4A and 4B are plan views illustrating an NMOS transistor and a PMOS transistor, respectively, according to embodiments.

Referring to FIG. 4A, the NMOS transistor may include a first gate electrode G[N] overlapping a first active region ACT[N] having an n-type channel. Parts of the first active region ACT[N] that protrude toward opposite sides of the first gate electrode G[N] may serve as a first source junction S[N] and a first drain junction D[N], respectively.

Referring to FIG. 4B, the PMOS transistor may include a second gate electrode G[P] overlapping a second active region ACT[P] having a p-type channel. Parts of the second active region ACT[P] that protrude toward opposite sides of the second gate electrode G[P] may serve as a second source junction S[P] and a second drain junction D[P], respectively.

Referring to FIGS. 4A and 4B, a second width W[P] of the second active region ACT[P] of the PMOS transistor may be greater than a first width W[N] of the first active region ACT[N] of the NMOS transistor. Accordingly, an area occupied by the PMOS transistor may be greater than an area occupied by the NMOS transistor. According to the present disclosure, a memory device may be designed such that a chip size may be reduced considering a difference in size between the NMOS transistor and the PMOS transistor described above.

Figure 5:
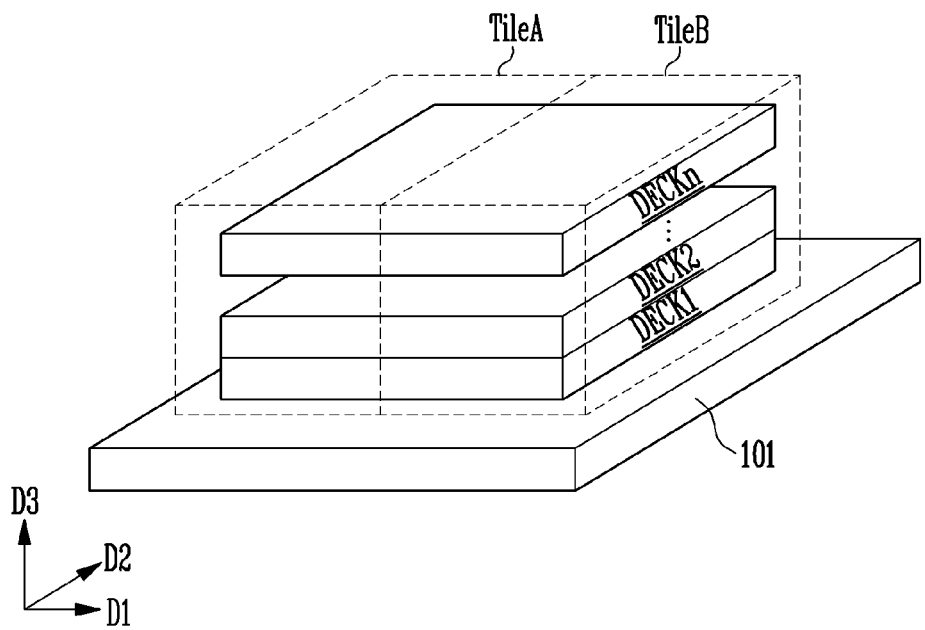
FIG. 5 illustrates a memory cell array including multiple decks according to an embodiment.

FIG. 5 illustrates a memory cell array including multiple decks according to an embodiment.

Referring to FIG. 5, the memory cell array may have a three-dimensional structure including first to nth decks DECK1 to DECKn stacked over a substrate 101 in a vertical direction D3, n being a natural number. Each of the first to nth decks DECK1 to DECKn may include a plurality of memory cells arranged in a matrix format in a first direction D1 and a second direction D2 on a plane perpendicular to the vertical direction D3. The first direction D1 and the second direction D2 may cross each other. For example, the first direction D1 and the second direction D2 may cross at right angles.

The first to nth decks DECK1 to DECKn may form a plurality of sub-arrays. Each of the sub-arrays may be referred to as a tile Tile. For example, the first to nth decks DECK1 to DECKn may be divided into a first tile Tile A and a second tile Tile B. However, the number of tiles formed by the first to nth decks DECK1 to DECKn is not limited thereto.

Each tile may include cross-point arrays including memory cells of the first to nth decks DECK1 to DECKn. Each of the cross-point arrays in the tile may include memory cells, each of which is coupled to a row line extending in the first direction D1 and a column line extending in the second direction D2. One of the row line and the column line may be the word line WL as described above with reference to FIG. 3A, and the other of the row line and the column line may be the bit line BL as described above with reference to FIG. 3A.

The row line of the cross-point array may be coupled to a row select transistor of a first select component corresponding thereto, and the column line of the cross-point array may be coupled to a column select transistor of a second select component corresponding thereto. As described above with reference to FIG. 3A, one of the first select component and the second select component may be the word line select component LXSW, and the other of the first select component and the second select component may be the bit line select component LYSW. The row select transistor may include an NMOS transistor corresponding to the NMOS transistor described above with reference to FIG. 4A, and the column select transistor may include a PMOS transistor corresponding to the PMOS transistor described above with reference to FIG. 4B.

According to embodiments of the present disclosure, first select components and second select components coupled to the first to nth decks DECK1 to DECKn may be designed considering the area occupied by the NMOS transistor and the PMOS transistor, respectively. Hereinafter, a memory device capable of reducing an area occupied by the first select components and the second select components including different types of transistors from each other will be described.

Figure 6:
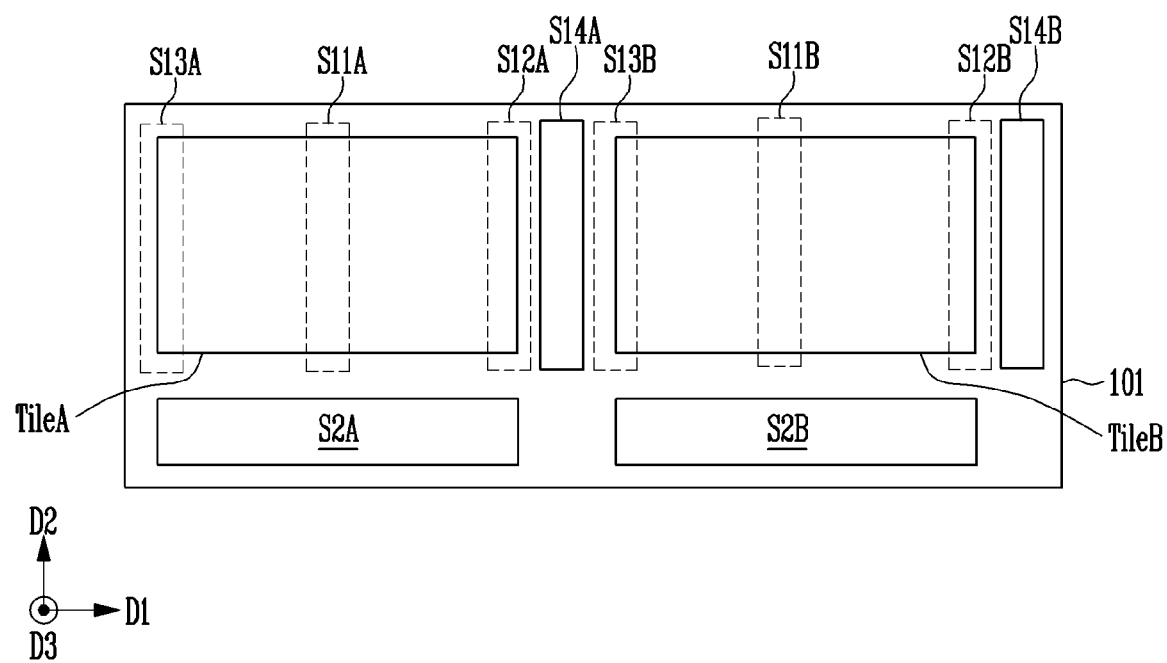
FIG. 6 illustrates a layout of a memory device according to an embodiment.

FIG. 6 illustrates a layout of first and second tiles Tile A and Tile B, first select components S11A to S14A and S11B to S14B, and second select components S2A and S2B of a memory device according to an embodiment of the present disclosure.

Referring to FIG. 6, each of the first and second tiles Tile A and Tile B may include parts of the first to nth decks DECK1 to DECKn as described above with reference to FIG. 5. For illustrative convenience, FIG. 6 shows the memory device having a four-deck structure including the first to fourth decks DECK1 to DECK4. However, embodiments of the present disclosure are not limited thereto.

A substrate 101 disposed below the first and second tiles Tile A and Tile B in a vertical direction D3 may include the first select components S11A to S14A and S11B to S14B and the second select components S2A and S2B. The first select components S11A to S14A and S11B to S14B may include a first group including the first select components S11A to S14A coupled to the first tile Tile A and a second group including the first select components S11B to S14B coupled to the second tile Tile B. The second select components S2A and S2B may include the second select component S2A coupled to the first tile Tile A and the second select component S2B coupled to the second tile Tile B. Each of the first select components S11A to S14A and S11B to S14B may include a plurality of NMOS transistors, and each of the second select components S2A and S2B may include a plurality of PMOS transistors.

Each of the second select components S2A and S2B may include the plurality of PMOS transistors having a relatively great size as described above with reference to FIGS. 4A and 4B. Each of the second select components S2A and S2B, which include the plurality of PMOS transistors, may be shared by decks of a tile corresponding thereto.

Each of the first select components S11A to S14A and S11B to S14B may include the plurality of NMOS transistors having a relatively small size as described above with reference to FIGS. 4A and 4B. Each of the first select components S11A to S14A and S11B to S14B may be coupled to a deck corresponding thereto.

According to the embodiment shown in FIG. 6, the first and second tiles Tile A and Tile B may include the first to fourth decks DECK1 to DECK4 stacked in the vertical direction D3. According to this embodiment, the first select components S11A to S14A of the first group may include the first select component S11A coupled to the first deck DECK1, the first select component S12A coupled to the second deck DECK2, the first select component S13A coupled to the third deck DECK3, and the first select component S14A coupled to the fourth deck DECK4. Similarly, the first select components S11B to S14B of the second group may include the first select component S11B coupled to the first deck DECK1, the first select component S12B coupled to the second deck DECK2, the first select component S13B coupled to the third deck DECK3, and the first select component S14B coupled to the fourth deck DECK4.

As described above, because each of the first select components S11A to S14A and the first select components S11B to S14B are coupled to the first to fourth decks DECK1 to DECK4, respectively, one of the first to fourth decks DECK1 to DECK4 may be selected by the first select components S11A to S14A and S11B to S14B. In addition, each of the second select components S2A and S2B which includes the PMOS transistors having a relatively great size may be designed to be shared by a plurality of decks corresponding thereto. Accordingly, a chip size may be reduced by reducing an area of the substrate 101 that is occupied by the PMOS transistors of the second select components S2A and S2B.

The first tile Tile A and the second tile Tile B may be neighboring each other in the first direction D1. The first select components S11A to S14A and S11B to S14B may be arranged to be spaced apart from each other in the first direction D1. The first select components S11A to S14A and S11B to S14B may include the first select components S11A to S13A and S11B to S13B overlapping a corresponding tile among the first and second tiles Tile A and Tile B. According to embodiments of the present disclosure, a chip size may be reduced by reducing an area of the substrate 101 that is occupied by a memory cell array and the first select components S11A to S14A and S11B to S14B.

Figure 7A:
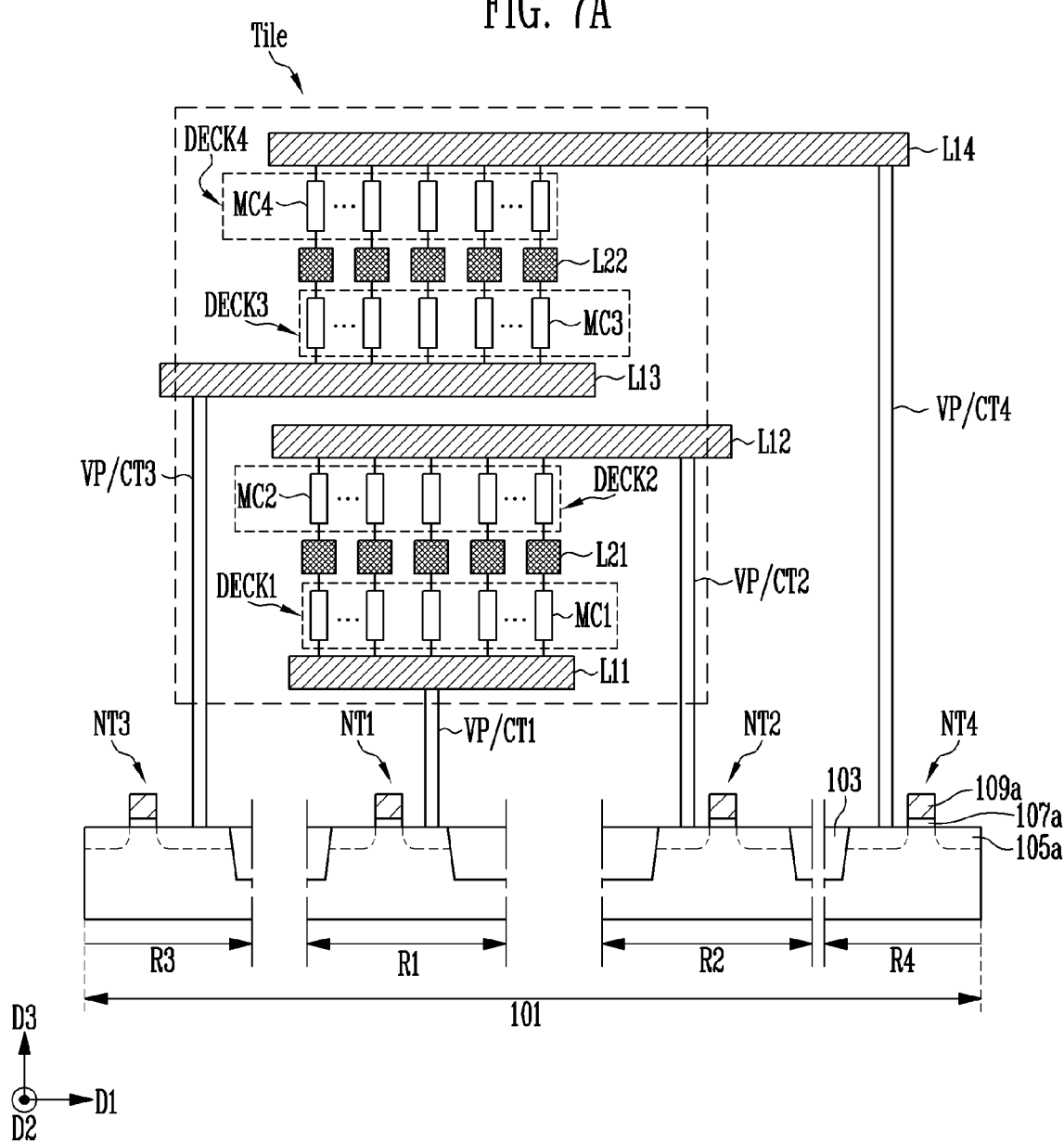
FIGS. 7A and 7B are cross-sectional views illustrating connection structures coupling first select components to a tile according to various embodiments.
Figure 7B:
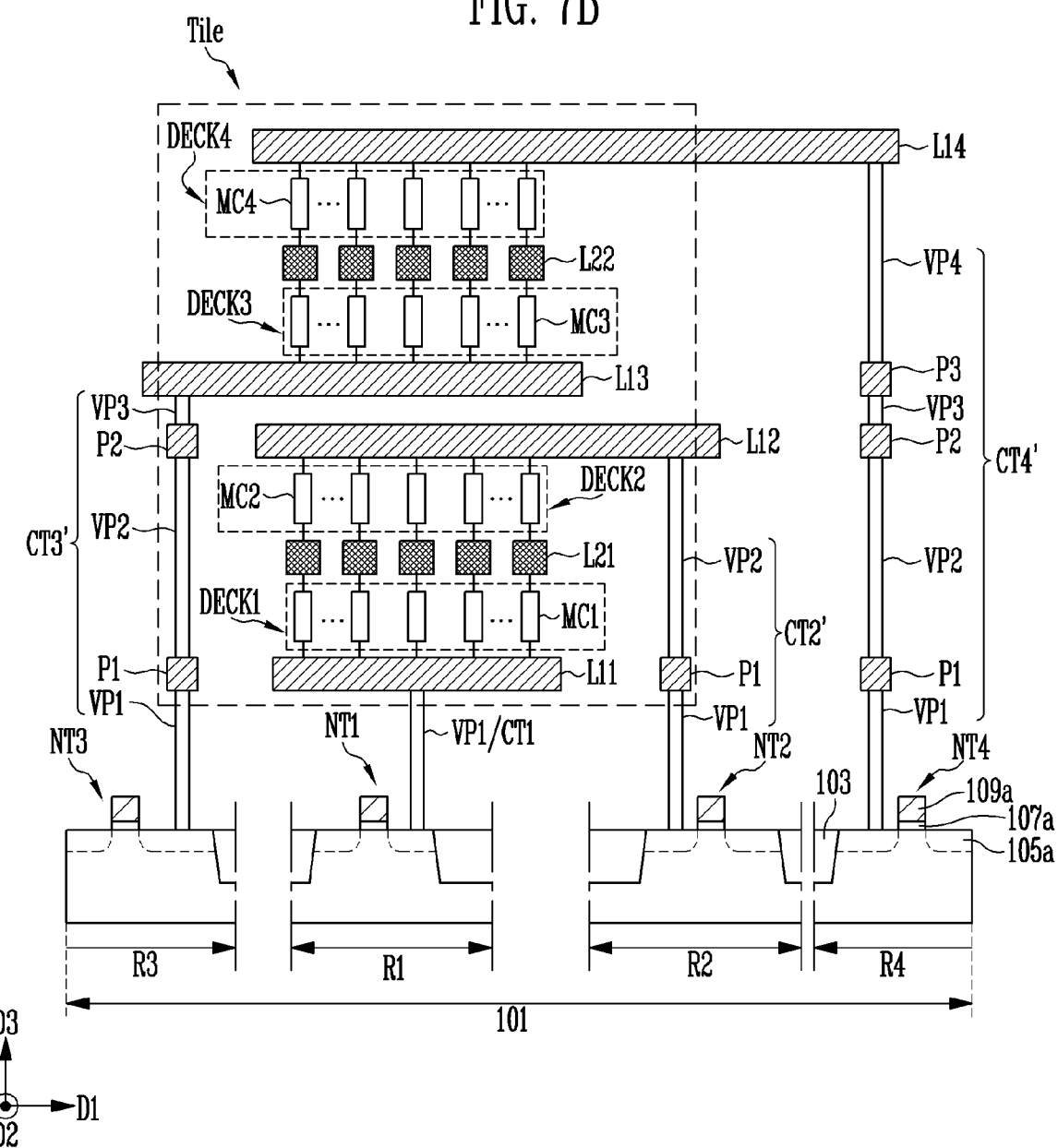
Figure 8:
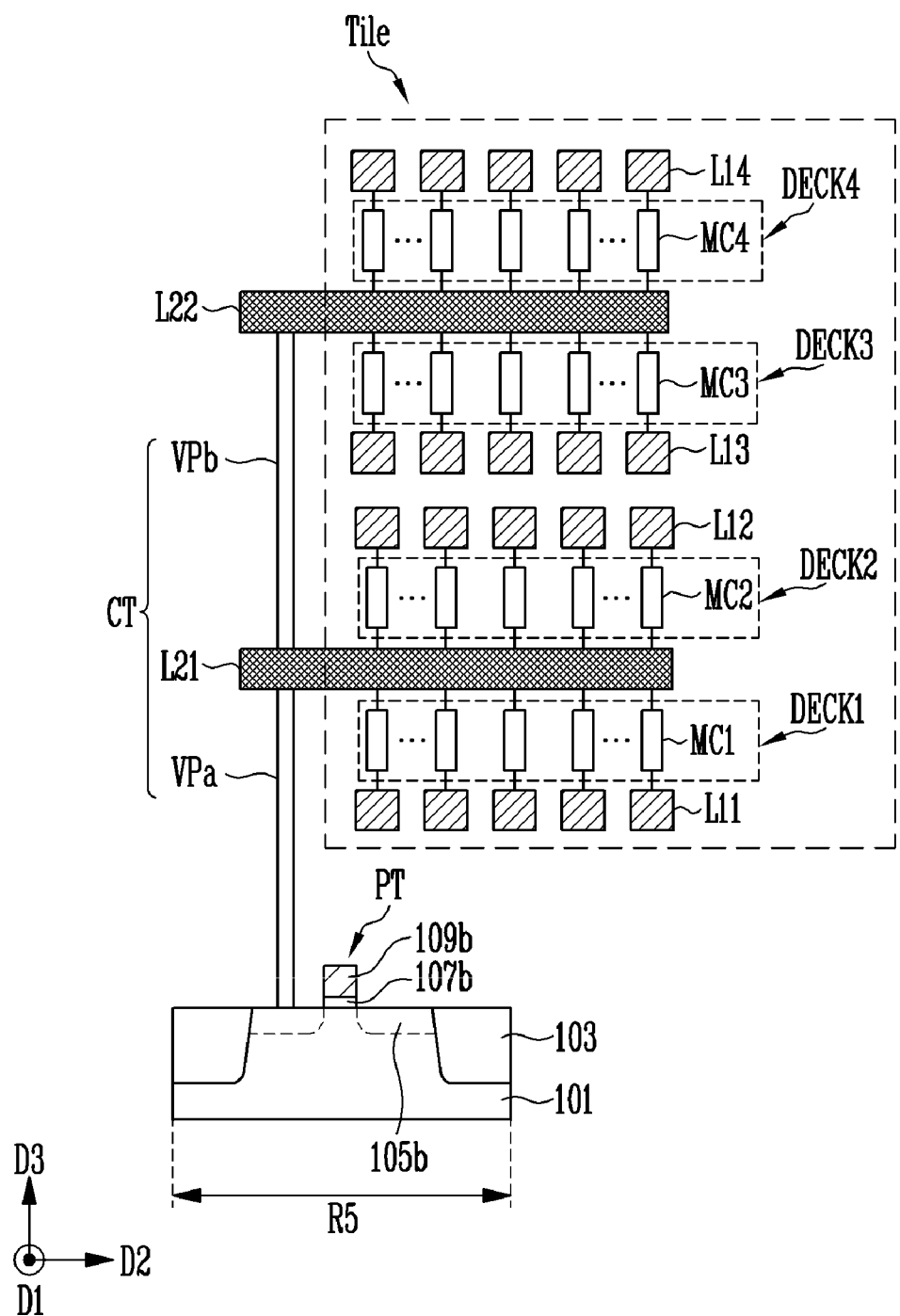
FIG. 8 is a cross-sectional view illustrating a connection structure coupling a second select component to a tile according to an embodiment.

FIGS. 7A and 7B are cross-sectional views of connection structures coupling first select components to a tile according to various embodiments. FIG. 8 is a cross-sectional view illustrating a connection structure coupling a second select component to a tile according to an embodiment. A tile Tile shown in each of FIGS. 7A, 7B, and 8 may correspond to the first tile Tile A or the second tile Tile B shown in FIG. 6.

Referring to FIGS. 7A, 7B, and 8, the tile Tile may include a part of each of first to nth decks DECK1 to DECKn stacked in the vertical direction D3. According to an embodiment, the tile Tile may include a plurality of first memory cells MC1 of the first deck DECK1, a plurality of second memory cells MC2 of the second deck DECK2, a plurality of third memory cells MC3 of the third deck DECK3, and a plurality of fourth memory cells MC4 of the fourth deck DECK4. The first to fourth decks DECK1 to DECK4 may be sequentially stacked over a substrate 101 including first to fifth regions R1 to R5 in the vertical direction D3. In other words, the plurality of second memory cells MC2 may be disposed over the plurality of first memory cells MC1, the plurality of third memory cells MC3 may be disposed over the plurality of second memory cells MC2, and the plurality of fourth memory cells MC4 may be disposed over the plurality of third memory cells MC3.

The first memory cells MC1 may be arranged in a matrix format in the first direction D1 and the second direction D2 that cross each other on a plane lying at right angles to the vertical direction D3. The second memory cells MC2 may be arranged in a matrix format in the first direction D1 and the second direction D2. The third memory cells MC3 may be arranged in a matrix format in the first direction D1 and the second direction D2. The fourth memory cells MC4 may be arranged in a matrix format in the first direction D1 and the second direction D2.

In the present disclosure, the first to nth decks DECK1 to DECKn may be coupled to first to nth row lines, respectively. The first to nth row lines may be stacked to be spaced apart from each other in the vertical direction D3 and may extend in parallel with each other. The first to nth decks DECK1 to DECKn may be coupled to column lines extending in a direction which crosses an extending direction of the first to nth row lines. The column lines may be stacked to be spaced apart from each other in the vertical direction D3. When numbering the first to nth row lines, the first to nth row lines may include odd-numbered row lines and even-numbered row lines that form a plurality of pairs. Each of the column lines may be disposed between an odd-numbered row line and an even-numbered row line of a pair corresponding to each of the column lines. When numbering the first to nth decks DECK1 to DECKn, the first to nth decks DECK1 to DECKn may form a plurality of pairs of decks, each pair including an odd-numbered deck and an even-numbered deck, and each of the column lines may be shared by a pair of decks corresponding thereto.

According to the embodiment shown in FIG. 7A, the first, second, third, and fourth decks DECK1, DECK2, DECK3, and DECK4 may be respectively coupled to first, second, third, and fourth row lines L11, L12, L13, and L14, which are stacked to be spaced apart from each other in the vertical direction D3. Each of the first, second, third, and fourth row lines L11, L12, L13, and L14 may extend in the first direction D1. The first, second, third, and fourth decks DECK1, DECK2, DECK3, and DECK4 may be classified into odd-numbered decks DECK1 and DECK3 and even-numbered decks DECK2 and DECK4 that are alternately stacked in the vertical direction D3. The first deck DECK1 among the odd-numbered decks DECK1 and DECK3 may form a first pair of decks with the second deck DECK2 among the even-numbered decks DECK2 and DECK4. The third deck DECK3 among the odd-numbered decks DECK1 and DECK3 may form a second pair of decks with the fourth deck DECK4 among the even-numbered decks DECK2 and DECK4. The first pair of the first deck DECK1 and the second deck DECK2 may share a first column line L21. The second pair of the third deck DECK3 and the fourth deck DECK4 may share a second column line L22. The first column line L21 and the second column line L22 may be stacked to be spaced apart from each other in the vertical direction D3, and may extend in the second direction D2 crossing the first direction D1. The first column line L21 may be disposed between the first row line L11 and the second row line L12, and the second column line L22 may be disposed between the third row line L13 and the fourth row line L14, in the vertical direction D3.

Each of the first memory cells MC1 of the first deck DECK1 may be connected to the first row line L11 and the first column line L21 corresponding thereto, and each of the second memory cells MC2 of the second deck DECK2 may be connected to the first column line L21 and the second row line L12 corresponding thereto. Each of the third memory cells MC3 of the third deck DECK3 may be connected to the third row line L13 and the second column line L22 corresponding thereto, and each of the fourth memory cells MC4 of the fourth deck DECK4 may be connected to the second column line L22 and the fourth row line L14 corresponding thereto.

According to an embodiment, the first, second, third, and fourth row lines L11, L12, L13, and L14 may serve as the word lines WLs as described above with reference to FIG. 2, and the first and second column lines L21 and L22 may serve as the bit lines BLs as described above with reference to FIG. 2. According to another embodiment, the first, second, third, and fourth row lines L11, L12, L13, and L14 may serve as the bit lines BLs as described above with reference to FIG. 2, and the first and second column lines L21 and L22 may serve as the word lines WLs as described above with reference to FIG. 2.

Each of the first, second, third, fourth, and fifth regions R1, R2, R3, R4, and R5 of the substrate 101 shown in FIGS. 7A, 7B, and 8 may include an active region. The active regions of the first, second, third, fourth, and fifth regions R1, R2, R3, R4, and R5 may be separated from each other by an isolation layer 103 disposed in the substrate 101. The first, second, third, and fourth regions R1, R2, R3, and R4 may be defined as regions in which the first select components S11A, S12A, S13A, and S14A or the first select components S11B, S12B, S13B, and S14B described above with reference to FIG. 6 are disposed, respectively. The fifth region R5 may be defined as a region in which one of the second select components S2A and S2B described above with reference to FIG. 6 is disposed.

Referring to FIGS. 7A and 7B, the first, second, third, and fourth regions R1, R2, R3, and R4 may be arranged in the first direction D1. The first region R1 may be disposed between the second region R2 and the third region R3, and the second region R2 may be disposed between the first region R1 and the fourth region R4. NMOS transistors NT1, NT2, NT3, and NT4 may be formed in the active regions of the first, second, third, and fourth regions R1, R2, R3, and R4, respectively. The NMOS transistors NT1, NT2, NT3, and NT4 may include the first NMOS transistor NT1 formed in the first region R1, the second NMOS transistor NT2 formed in the second region R2, the third NMOS transistor NT3 formed in the third region R3, and the fourth NMOS transistor NT4 formed in the fourth region R4. Each of the first, second, third, and fourth NMOS transistors NT1, NT2, NT3, and NT4 may include a gate insulating layer 107a and a gate electrode 109a stacked over the corresponding active region, and may also include junctions 105a formed in the active region in opposite sides of the gate electrode 109a. The junctions 105a of each of the first, second, third, and fourth NMOS transistors NT1, NT2, NT3, and NT4 may serve as a source junction and a drain junction as described above with reference to FIG. 4A.

The plurality of first memory cells MC1, the plurality of second memory cells MC2, the plurality of third memory cells MC3, and the plurality of fourth memory cells MC4 included in the tile Tile may overlap the first region R1. The first region R1 may be electrically coupled to the first row line L11 through a first connection structure CT1 including a conductive material.

Ends of the even-numbered row lines L12 and L14 among the second, third, and fourth row lines L12, L13, and L14 may be electrically coupled to the substrate 101 through even-numbered connection structures CT2 and CT4, respectively, shown in FIG. 7A or even-numbered connection structures CT2' and CT4', respectively, shown in FIG. 7B. An end of the odd-numbered row line L13 among the second, third, and fourth row lines L12, L13, and L14 may be electrically coupled to the substrate 101 through an odd-numbered connection structure CT3 shown in FIG. 7A or an odd-numbered connection structure CT3' shown in FIG. 7B. The end of the odd-numbered row line L13 may face an opposite direction to the ends of the even-numbered row lines L12 and L14. The even-numbered connection structures CT2 and CT4 shown in FIG. 7A or the even-numbered connection structures CT2' and CT4' shown in FIG. 7B may be spaced apart from the odd-numbered connection structure CT3 or CT3' corresponding thereto with the first connection structure CT1 and the first row line L11 interposed therebetween. The even-numbered connection structures CT2, CT4, CT2', and CT4' and the odd-numbered connection structures CT3 and CT3' may include any of various conductive materials.

Referring to FIG. 7A, each of the first connection structure CT1, the second connection structure CT2, the third connection structure CT3, and the fourth connection structure CT4 may include a via plug VP extending from the substrate 101 in the vertical direction D3. Accordingly, the first to fourth connection structures CT1 to CT4 may be called vertical connection structures.

The via plug VP of the first connection structure CT1 may extend from the first row line L11 to be in contact with the first region R1 of the substrate 101. The via plug VP of the first connection structure CT1 may be in contact with a central region of the first row line L11 and one of the junctions 105a of the first NMOS transistor NT1.

The via plugs VP of the second, third, and fourth connection structures CT2, CT3, and CT4 may respectively extend from ends of corresponding row lines to be in contact with the substrate 101. In particular, the via plug VP of the second connection structure CT2 may extend from an end of the second row line L12 to be in contact with the second region R2 of the substrate 101. The via plug VP of the second connection structure CT2 may be in contact with the end of the second row line L12 and one of the junctions 105a of the second NMOS transistor NT2. The via plug VP of the third connection structure CT3 may extend from an end of the third row line L13 to be in contact with the third region R3 of the substrate 101. The via plug VP of the third connection structure CT3 may be in contact with the end of the third row line L13 and one of the junctions 105a of the third NMOS transistor NT3. The via plug VP of the fourth connection structure CT4 may extend from an end of the fourth row line L14 to be in contact with the fourth region R4 of the substrate 101. The via plug VP of the fourth connection structure CT4 may be in contact with the end of the fourth row line L14 and one of the junctions 105a of the fourth NMOS transistor NT4.

Referring to FIG. 7B, the first connection structure CT1, the second connection structure CT2', the third connection structure CT3', and the fourth connection structure CT4' may include one or more of first, second, third, and fourth via plugs VP1, VP2, VP3, and VP4. The second, third, and fourth connection structures CT2', CT3', and CT4' may further include one or more of first, second, and third contact pads P1, P2, and P3 each having a width greater than a width of each of the first, second, third, and fourth via plugs VP1, VP2, VP3, and VP4. The first contact pads P1 may be disposed at the same level as the first row line L11, and may be separated from the first row line L11. The second contact pads P2 may be disposed at the same level as the second row line L12, and may be separated from the second row line L12. The third contact pad P3 may be disposed at the same level as the third row line L13, and may be separated from the third row line L13.

The first connection structure CT1 may include the first via plug VP1, which is in contact with the first region R1 of the substrate 101, among the first via plugs VP1 extending from the substrate 101 in the vertical direction D3. The first via plug VP1 of the first connection structure CT1 may be disposed in the same position as the via plug VP of the first connection structure CT1 described above with reference to FIG. 7A.

The second connection structure CT2' may include one of the first via plugs VP1, one of the first contact pads P1, and one of the second via plugs VP2. The first via plug VP1, the first contact pad P1, and the second via plug VP2 included in the second connection structure CT2' may be stacked between the second region R2 of the substrate 101 and the end of the second row line L12 in the vertical direction D3. The first via plug VP1 of the second connection structure CT2' may extend from the second region R2 of the substrate 101 in the vertical direction D3 to be in contact with the corresponding first contact pad P1. The first via plug VP1 of the second connection structure CT2' may be in contact with one of the junctions 105a of the second NMOS transistor NT2. The second via plug VP2 of the second connection structure CT2' may extend from the corresponding first contact pad P1 in the vertical direction D3 to be in contact with the end of the row line L12.

The third connection structure CT3' may include one of the first via plugs VP1, one of the first contact pads P1, one of the second via plugs VP2, one of the second contact pads P2, and one of the third via plugs VP3. The first via plug VP1, the first contact pad P1, the second via plug VP2, the second contact pad P2, and the third via plug VP3 included in the third connection structure CT3' may be stacked between the third region R3 of the substrate 101 and the end of the third row line L13 in the vertical direction D3. The first via plug VP1 of the third connection structure CT3' may extend from the third region R3 of the substrate 101 in the vertical direction D3 to be in contact with the corresponding first contact pad P1. The first via plug VP1 of the third connection structure CT3' may be in contact with one of the junctions 105a of the third NMOS transistor NT3. The second via plug VP2 of the third connection structure CT3' may extend from the corresponding first contact pad P1 in the vertical direction D3 to be in contact with the corresponding second contact pad P2. The third via plug VP3 of the third connection structure CT3' may extend from the corresponding second contact pad P2 in the vertical direction D3 to be in contact with the end of the third row line L13.

The fourth connection structure CT4' may include one of the first via plugs VP1, one of the first contact pads P1, one of the second via plugs VP2, one of the second contact pads P2, one of the third via plugs VP3, the third contact pad P3, and the fourth via plug VP4. The first via plug VP1, the first contact pad P1, the second via plug VP2, the second contact pad P2, the third via plug VP3, the third contact pad P3, and the fourth via plug VP4 included in the fourth connection structure CT4' may be stacked between the fourth region R4 of the substrate 101 and the end of the fourth row line L14 in the vertical direction D3. The first via plug VP1 of the fourth connection structure CT4' may extend from the fourth region R4 of the substrate 101 in the vertical direction D3 to be in contact with the corresponding first contact pad P1. The first via plug VP1 of the fourth connection structure CT4' may be in contact with one of the junctions 105a of the fourth NMOS transistor NT4. The second via plug VP2 of the fourth connection structure CT4' may extend from the corresponding first contact pad P1 in the vertical direction D3 to be in contact with the corresponding second contact pad P2. The third via plug VP3 of the fourth connection structure CT4' may extend from the corresponding second contact pad P2 in the vertical direction D3 to be in contact with the third contact pad P3. The fourth via plug VP4 may extend from the third contact pad P3 in the vertical direction D3 to be in contact with the end of the fourth row line L14.

Referring to FIG. 8, the first and second column lines L21 and L22 may be electrically coupled to the fifth region R5 of the substrate 101 through a connection structure CT including a conductive material. The connection structure CT may include a lower via plug VPa extending from the substrate 101 in the vertical direction D3 to be in contact with the first column line L21 and an upper via plug VPb extending from the first column line L21 in the vertical direction D3 to be in contact with the second column line L22. The connection structure CT may be called a vertical connection structure. The connection structure CT may be coupled to a corresponding one of the column select transistors included in the second select component. Each of the column select transistors may include a PMOS transistor PT formed in the fifth region R5 of the substrate 101. The PMOS transistor PT may include a gate insulating layer 107b and a gate electrode 109b stacked over the corresponding active region, and may also include junctions 105b formed in the active region in opposite sides of the gate electrode 109b. The junctions 105b of the PMOS transistor PT may serve as a source junction and a drain junction, as described above with reference to FIG. 4B.

Each pair of the first and second column lines L21 and L22 shown in FIGS. 7A, 7B, and 8 may be coupled to a PMOS transistor PT corresponding thereto. Accordingly, the pair of the first and second column lines L21 and L22 may be selected at the same time according to an operation of the PMOS transistor PT. The first, second, third, and fourth row lines L11, L12, L13, and L14 shown in FIGS. 7A, 7B, and 8 may be coupled to different NMOS transistors, respectively. Accordingly, each of the first, second, third, and fourth row lines L11, L12, L13, and L14 may be individually selected according to an operation of the NMOS transistor corresponding thereto. The first, second, third, and fourth memory cells MC1, MC2, MC3, and MC4 shown in FIGS. 7A, 7B, and 8 may be individually selected by the first, second, third, and fourth row lines L11, L12, L13, and L14 which may be individually selected.

Figure 9:
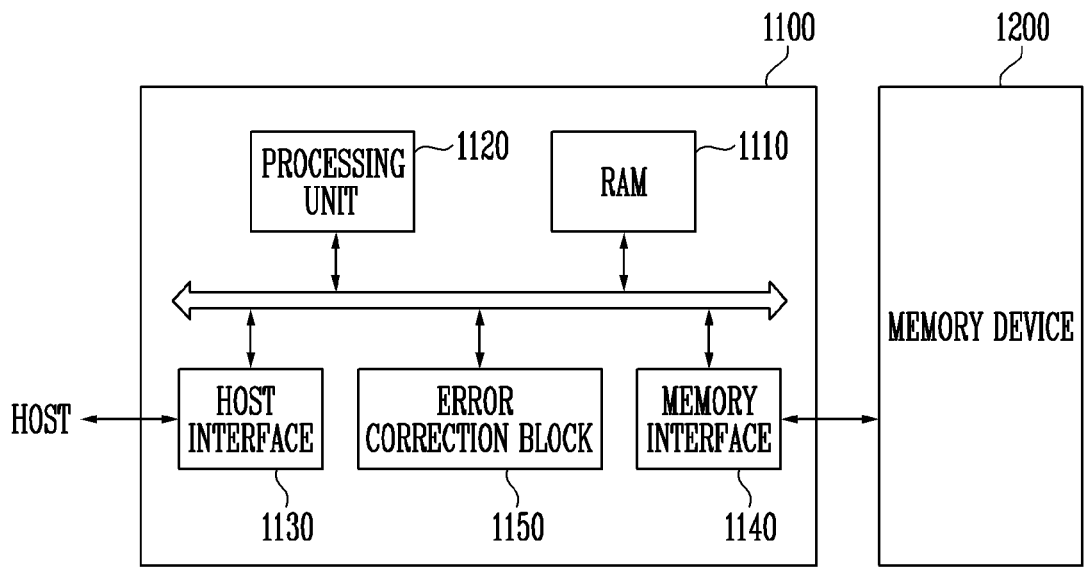
FIGS. 9 and 10 are block diagrams illustrating memory systems according to various embodiments.
Figure 10:
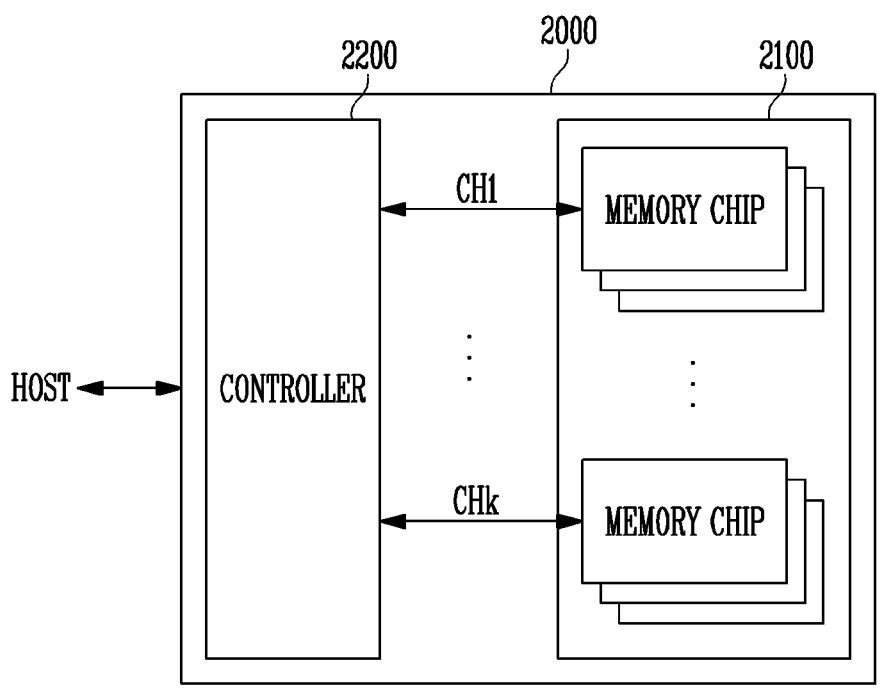

FIGS. 9 and 10 are block diagrams illustrating memory systems according to various embodiments.

Referring to FIG. 9, a memory system 1000 may include a memory device 1200 and a controller 1100.

The memory device 1200 may include row lines stacked over a substrate and coupled to NMOS transistors, respectively, as illustrated in FIG. 7A or 7B. In addition, the memory device 1200 may include column lines, each of which is shared by pairs of memory cells, each coupled to different row lines disposed in a vertical direction, and a PMOS transistor is coupled in common to the column lines, as illustrated in FIG. 8.

The controller 1100 may be coupled to a host and the memory device 1200. The controller 1100 may be configured to access the memory device 1200 in response to a request from the host. For example, the controller 1100 may control a read operation, a write operation, and a background operation of the memory device 1200.

The controller 1100 may provide an interface between the memory device 1200 and the host. The controller 1100 may run firmware for controlling the memory device 1200.

The controller 1100 may include a Random Access Memory (RAM) 1110, a processing unit 1120, a host interface 1130, a memory interface 1140, and an error correction block 1150.

The RAM 1110 may serve as one of an operation memory of the processing unit 1120, a cache memory between the memory device 1200 and the host, and a buffer memory between the memory device 1200 and the host. The processing unit 1120 may control general operations of the controller 1100. In addition, the controller 1100 may temporarily store program data provided from the host during a program operation.

The host interface 1130 may include a protocol for data exchange between the host and the controller 1100. The protocol may be one of protocols such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small computer small interface (SCSI) protocol, a Serial attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory interface 1140 may provide an interface between the controller 1100 and the memory device 1200. For example, the memory interface 1140 may include a NAND interface or a NOR interface.

The error correction block 1150 may be configured to use an Error Correcting Code (ECC) to detect and correct an error in data received from the memory device 1200. The processing unit 1120 may adjust a read voltage according to an error detection result of the error correction block 1150 and control the memory device 1200 to perform a read operation.

The controller 1100 and the memory device 1200 may be integrated into a single semiconductor device. According to an embodiment, the controller 1100 and the memory device 1200 may be integrated into a single semiconductor device to form a memory card. For example, the memory card may be a PC card such as a personal computer memory card international association (PCMCIA), a compact flash (CF) card, a smart media (SM or SMC) card, a memory stick, a multimedia (MMC, RS-MMC, or MMCmicro) card, an SD (SD, miniSD, microSD, or SDHC) card, or a universal flash storage (UFS).

The controller 1100 and the memory device 1200 may be integrated into a single semiconductor device to form a Solid State Drive (SSD). When the memory system 1000 is used as an SSD, operational rates of a host coupled to the memory system 1000 may be improved.

In another example, the memory system 1000 may be provided as one of various elements of an electronic device. The electronic device may be a computer, an Ultra Mobile PC (UMPC), a workstation, a net-book, Personal Digital Assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, a device for forming a home network, a device for forming a computer network, a device for forming a telematics network, an RFID device, or the like. Alternatively, the electronic device may be one of various elements for forming a computing system.

According to an embodiment, the memory device 1200 or the memory system 1000 may be embedded in a package in various forms. For example, the memory device 1200 or the memory system 1000 may be embedded in a package such as a Package on Package (PoP), Ball grid arrays (BGAs), Chip scale packages (CSPs), a Plastic Leaded Chip Carrier (PLCC), a Plastic Dual In Line Package (PDIP), a Die in Waffle Pack, a Die in Wafer Form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi-Chip Package (MCP), a Wafer-level Fabricated Package (WFP), or a Wafer-Level Processed Stack Package (WSP).

Referring to FIG. 10, a memory system 2000 may include a memory device 2100 and a controller 2200. The memory device 2100 may include a plurality of semiconductor memory chips. The plurality of semiconductor memory chips may be divided into a plurality of groups.

The plurality of groups may communicate with the controller 2200 through first to kth channels CH1 to CHk, respectively, where k is a natural number. Each of the semiconductor memory chips may be configured and operate as the memory device 1200 described above with reference to FIG. 9.

Each of the plurality of groups may be configured to communicate with the controller 2200 through a single common channel. The controller 2200 may be configured in substantially the same manner as the controller 1100 described with reference to FIG. 9, and configured to control the plurality of memory chips of the memory device 2100 through the first to kth channels CH1 to CHk.

Figure 11:
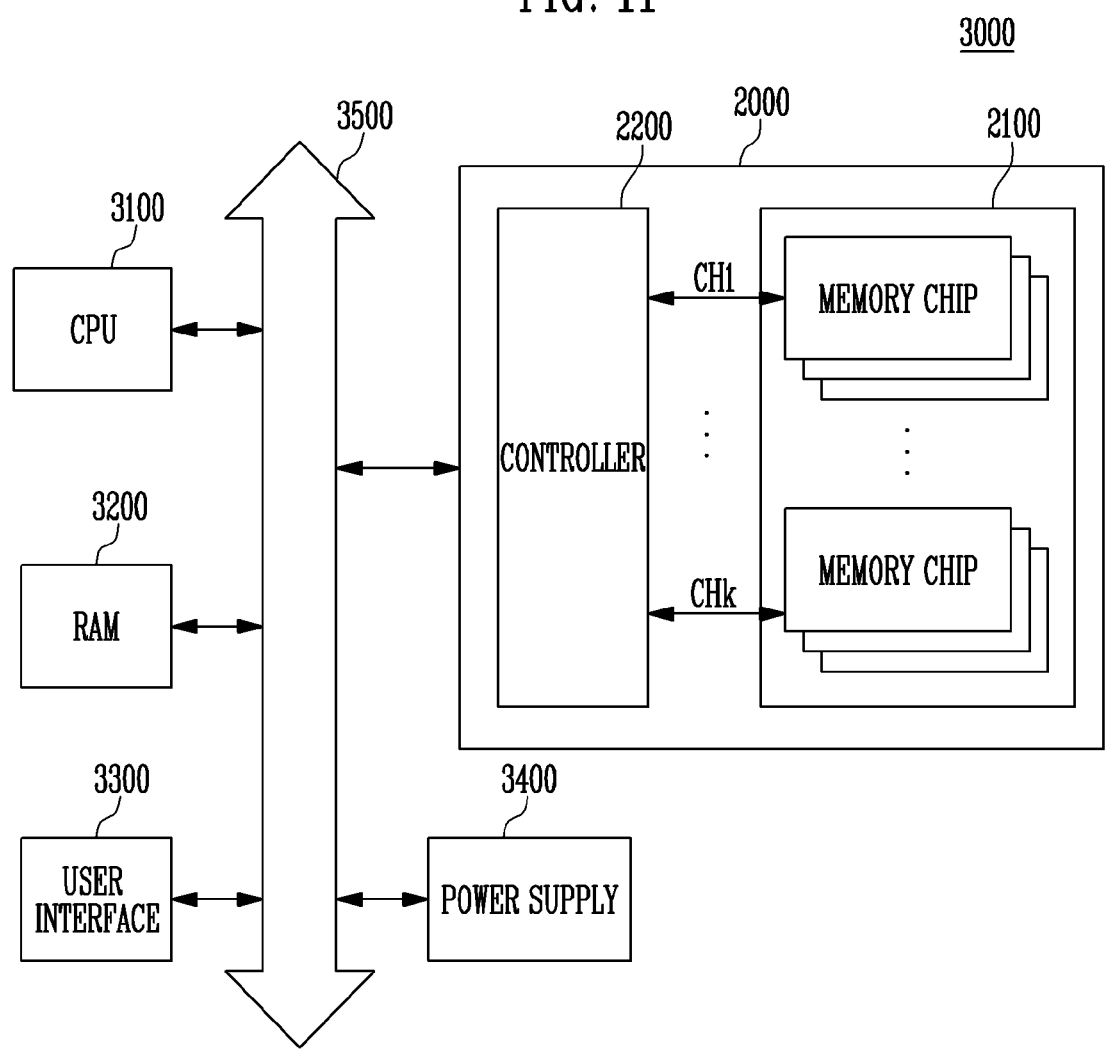
FIG. 11 is a block diagram illustrating a computing system according to an embodiment.

FIG. 11 is a block diagram illustrating a computing system 3000 according to an embodiment.

The computing system 3000 may include a central processing unit (CPU) 3100, a Random Access Memory (RAM) 3200, a user interface 3300, a power supply 3400, a system bus 3500, and a memory system 2000.

The memory system 2000 may be electrically connected to the CPU 3100, the RAM 3200, the user interface 3300, and the power supply 3400 through the system bus 3500. Data provided through the user interface 3300 or data processed by the CPU 3100 may be stored in the memory system 2000.

The memory system 2000 may include a controller 2200 and a memory device 2100. The memory device 2100 may be coupled to the system bus 3500 through the controller 2200. Alternatively, the memory device 2100 may be configured to be directly coupled to the system bus 3500. The functions of the controller 2200 may be performed by the CPU 3100 and the RAM 3200.

FIG. 11 illustrates the computing system 3000 including the memory system 2000 described above with reference to FIG. 10. However, embodiments of the present disclosure are not limited thereto. For example, the memory system 2000 of the computing system 3000 may be replaced with the memory system 1000 described with reference to FIG. 9. According to an embodiment, the computing system 3000 may be configured to include both of the memory systems 1000 and 2000 described above with reference to FIGS. 9 and 10, respectively.

According to the present disclosure, a memory device may be designed such that row lines are coupled to a peripheral circuit of a substrate to individually select the row lines stacked over the substrate and such that an area occupied by the peripheral circuit may be reduced. Accordingly, a chip size of the memory device may be reduced.

What is claimed is:

1. A memory device, comprising:
   first to nth decks respectively coupled to first to nth row lines which are stacked over a substrate in a vertical direction perpendicular to a surface of the substrate, n being a positive integer;
   a first connection structure extending from the substrate in the vertical direction to be coupled to the first row line;
   even-numbered connection structures extending from the substrate in the vertical direction and respectively coupled to ends of even-numbered row lines among the second to nth row lines; and
   odd-numbered connection structures extending from the substrate in the vertical direction and respectively coupled to ends of odd-numbered row lines among the second to nth row lines,
   wherein the even-numbered connection structures are spaced apart from the odd-numbered connection structures with the first row line and the first connection structure that are interposed between the even-numbered connection structures and the odd-numbered connection structures, and
   wherein the first row line, the even-numbered row lines, and the odd-numbered row lines are stacked in the vertical direction.

2. The memory device of claim 1, further comprising:
   column lines crossing the first to nth row lines and stacked in the vertical direction;
   a connection structure coupling the column lines together; and
   a column select transistor coupled to the connection structure and formed in the substrate.

3. The memory device of claim 2, wherein the first to nth decks form a plurality of pairs of decks, each including an odd-numbered deck and an even-numbered deck, and
   wherein the column lines are shared by the pairs of decks, respectively.

4. The memory device of claim 2, wherein the column select transistor includes a P-channel metal oxide semiconductor (PMOS) transistor.

5. The memory device of claim 1, wherein the first connection structure, the even-numbered connection structures, and the odd-numbered connection structures are coupled to N-channel metal oxide semiconductor (NMOS) transistors formed in the substrate, respectively.

6. A memory device, comprising:
   a substrate including first select components, which include N-channel metal oxide semiconductor (NMOS) transistors, and a second select component, which includes P-channel metal oxide semiconductor (PMOS) transistors;
   a plurality of decks each including a plurality of memory cells and stacked over the substrate in a vertical direction perpendicular to a surface of the substrate;
   row lines coupled to the first select components, respectively, and coupled to the decks, respectively; and
   column lines coupled in common to one of the PMOS transistors of the second select component, and coupled to the decks, wherein the column lines are stacked in the vertical direction.

7. The memory device of claim 6, wherein the row lines include odd-numbered row lines and even-numbered row lines that form a plurality of pairs and are alternately stacked in the vertical direction, and
   wherein each of the column lines is disposed between an odd-numbered row line and an even-numbered row line of a corresponding pair among the pairs of the odd-numbered row lines and the even-numbered row lines, the column lines extending in a direction crossing the row lines.

8. The memory device of claim 6, further comprising a connection structure coupling each of the row lines to a corresponding NMOS transistor among the NMOS transistors.

9. A memory device, comprising:
   a substrate;
   a P-channel metal oxide semiconductor (PMOS) transistor formed in the substrate;
   first to fourth N-channel metal oxide semiconductor (NMOS) transistors formed in the substrate, wherein the first NMOS transistor is disposed between the second NMOS transistor and the third NMOS transistor, and the second NMOS transistor is disposed between the first NMOS transistor and the fourth NMOS transistor;
   first to fourth row lines coupled to the first to fourth NMOS transistors, respectively, spaced apart from each other in a vertical direction perpendicular to a surface of the substrate, and extending in parallel with each other;
   first and second column lines coupled in common to the PMOS transistor, spaced apart from each other in the vertical direction, and extending in a direction which crosses a direction in which the first to fourth row lines extend;
   a first memory cell coupled to the first row line and the first column line;
   a second memory cell coupled to the second row line and the first column line;
   a third memory cell coupled to the third row line and the second column line; and
   a fourth memory cell coupled to the fourth row line and the second column line.

10. The memory device of claim 9, wherein the first to fourth memory cells are stacked over the substrate in the vertical direction.

11. The memory device of claim 9, wherein the first column line is disposed between the first and second row lines, and
    wherein the second column line is disposed between the third and fourth row lines.

12. The memory device of claim 9, wherein the first to fourth row lines and the first and second column lines overlap the first NMOS transistor.

13. The memory device of claim 9, further comprising connection structures coupled to the first to fourth NMOS transistors, respectively, and extending toward the first to fourth row lines in the vertical direction.

14. The memory device of claim 9, further comprising a connection structure coupling the PMOS transistor to the first and second column lines in the vertical direction.

15. The memory device of claim 13, wherein the connection structures comprises:
    a first connection structure coupled to and disposed between the first NMOS transistor and the first row line;

a second connection structure coupled to and disposed between the second NMOS transistor and the second row line;
a third connection structure coupled to and disposed between the third NMOS transistor and the third row line; and
a fourth connection structure coupled to and disposed between the fourth NMOS transistor and the fourth row line,
wherein the third connection structure is spaced apart from the second and fourth connection structures with the first connection structure interposed between the third connection structure and the second and fourth connection structures.

* * * * *